United States Patent
Wisnewski et al.

(10) Patent No.: US 9,728,024 B2
(45) Date of Patent: Aug. 8, 2017

(54) FOB WITH INCREASED POWER LEVEL FROM HAND-ANTENNA COUPLING

(71) Applicant: Ford Global Technologies, LLC, Dearborn, MI (US)

(72) Inventors: Mark Wisnewski, Stockbridge, MI (US); Tye Arthur Winkel, Canton, MI (US); John Frederick Locke, Waterford, MI (US); Lawrence Banasky, Livonia, MI (US); Thomas Joseph Hermann, Troy, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 8 days.

(21) Appl. No.: 14/862,186

(22) Filed: Sep. 23, 2015

(65) Prior Publication Data

US 2017/0084099 A1    Mar. 23, 2017

(51) Int. Cl.
| | |
|---|---|
| *H04W 52/16* | (2009.01) |
| *H04W 88/02* | (2009.01) |
| *H04B 1/02* | (2006.01) |
| *H04B 17/00* | (2015.01) |
| *H04B 1/18* | (2006.01) |
| *G07C 9/00* | (2006.01) |
| *H04W 52/18* | (2009.01) |
| *H04W 52/28* | (2009.01) |

(Continued)

(52) U.S. Cl.
CPC ......... *G07C 9/00309* (2013.01); *H03F 3/245* (2013.01); *H04W 52/18* (2013.01); *H04W 52/283* (2013.01); *H04W 52/42* (2013.01); *G07C 2009/00769* (2013.01); *G07C 2009/00984* (2013.01); *H04W 52/50* (2013.01)

(58) Field of Classification Search
CPC ... H04W 52/16; H04W 52/325; H04W 88/02; H04B 1/02; H04B 1/034; H04B 15/00; H04B 17/00; H04B 1/18
USPC .......... 455/95, 127, 91, 574; 340/5.72, 10.1, 340/10.5, 572.8, 572.7; 330/278
See application file for complete search history.

(56) References Cited

U.S. PATENT DOCUMENTS

| | | |
|---|---|---|
| 5,281,970 A | 1/1994 | Blaese |
| 6,127,740 A | 10/2000 | Roddy et al. |

(Continued)

FOREIGN PATENT DOCUMENTS

| | | |
|---|---|---|
| JP | 3314989 B2 | 8/2002 |

OTHER PUBLICATIONS

Notice of Allowance dated May 4, 2016; U.S. Appl. No. 14/672,534, filed Mar. 30, 2015; 23 pages.

(Continued)

*Primary Examiner* — Nam V Nguyen
(74) *Attorney, Agent, or Firm* — Frank A. MacKenzie; Bejin Bieneman PLC

(57) ABSTRACT

A key fob includes a power amplifier including an output having an output impedance. A radio frequency antenna connected to the power amplifier output represents a first load impedance to the power amplifier output in a space substantially free of interference for radio frequency transmissions, and a second load impedance to the power amplifier output when a hand of a user is capacitively coupled to the antenna. The difference between the second load impedance and the output impedance of the power amplifier is less than the difference between the first load impedance and the output impedance.

20 Claims, 8 Drawing Sheets

(51) Int. Cl.
*H04W 52/42* (2009.01)
*H03F 3/24* (2006.01)
*H04W 52/50* (2009.01)

(56) References Cited

U.S. PATENT DOCUMENTS

| | | | |
|---|---|---|---|
| 6,230,031 B1 | 5/2001 | Barber | |
| 6,281,599 B1 | 8/2001 | Murakami | |
| 6,545,629 B1 | 4/2003 | Johnson et al. | |
| 6,597,897 B2 * | 7/2003 | Tang | B60R 25/24 330/278 |
| 7,034,238 B2 | 4/2006 | Uleski et al. | |
| 7,545,259 B2 | 6/2009 | Luo et al. | |
| 7,724,125 B2 | 5/2010 | Ghabra et al. | |
| 7,933,324 B2 | 4/2011 | Ghabra et al. | |
| 7,944,340 B1 | 5/2011 | Ghabra et al. | |
| 8,270,914 B2 * | 9/2012 | Pascolini | H01Q 1/243 343/702 |
| 9,002,278 B2 * | 4/2015 | Anderson | H04B 1/18 343/745 |
| 9,203,463 B2 * | 12/2015 | Asrani | H04B 1/68 |
| 9,369,163 B2 * | 6/2016 | Chen | H04B 1/1607 |
| 2002/0028663 A1 | 3/2002 | Tang | |
| 2002/0180650 A1 | 12/2002 | Pankinaho et al. | |
| 2003/0197640 A9 | 10/2003 | Johnson et al. | |
| 2004/0160352 A1 | 8/2004 | Shimizu et al. | |
| 2004/0263316 A1 | 12/2004 | Dix et al. | |
| 2005/0242923 A1 | 11/2005 | Pearson | |
| 2006/0132360 A1 | 6/2006 | Caimi et al. | |
| 2007/0093219 A1 | 4/2007 | Nakasato | |
| 2009/0182587 A1 | 7/2009 | Lewis | |
| 2009/0243796 A1 | 10/2009 | Tieman | |
| 2009/0289860 A1 | 11/2009 | Lee et al. | |
| 2012/0071203 A1 * | 3/2012 | Wong | H01Q 1/243 455/550.1 |
| 2012/0329524 A1 * | 12/2012 | Kent | G06F 3/044 455/566 |
| 2013/0109375 A1 | 5/2013 | Zeiler et al. | |
| 2014/0125535 A1 | 5/2014 | Ramachandran et al. | |
| 2014/0240125 A1 | 8/2014 | Burch et al. | |
| 2015/0116078 A1 | 4/2015 | Mishra | |
| 2017/0019134 A1 * | 1/2017 | Zhou | H03F 3/195 |

OTHER PUBLICATIONS

Delphi key fob could provide 1-km range, SAE International, Apr. 27, 2010 (2 pages).
UK Search Report dated Feb. 28, 2017 (4 pages).
Non-Final Office Action dated Mar. 22, 2017 in co-pending U.S. Appl. No. 14/672,544; 30 pages.

* cited by examiner

FOB WITH INCREASED POWER LEVEL FROM HAND-ANTENNA COUPLING

CROSS-REFERENCE TO RELATED APPLICATIONS

This application is related to U.S. patent application Ser. No. 14/672,521 filed Mar. 30, 2015 entitled "KEY FOB TRANSMISSION COMPENSATION, U.S. patent application Ser. No. 14/672,534, filed Mar. 30, 2015 entitled "KEY FOB TRANSMISSION COMPENSATION", and U.S. patent application Ser. No. 14/672,544 FILED Mar. 30, 2015 entitled FOB CASE FOR REDUCED TRANSMISSION INTERFERENCE, the complete contents of which are hereby incorporated herein by reference in their entirety.

BACKGROUND

A remote keyless entry system (RKE system) includes a remote device, sometimes called a fob or key fob, used by a vehicle operator in communication with a base unit embedded in the vehicle. The RKE system's range, i.e., the possible distance between the fob operated by the vehicle operator and the base unit, is a characteristic of perceived system quality. The system's range varies according to the fob's radio frequency (RF) output power, and is typically designed for maximum power, and therefore maximum range, when operating in free space. An object, e.g., a person's hand operating the fob, proximate to the antenna may reduce the output power, resulting in a reduction of range. One solution for preventing or reducing an amount of power loss caused by a hand holding the fob is to design the fob such that the antenna is in a location where it is not likely to be interfered with by the hand. However, in some fobs, due to, e.g., size limitations, this may be difficult.

DESCRIPTION

Introduction

As described above, a fob is typically designed for maximum power output in free space. Free space may be defined, with regard to an operation of the fob, as a space substantially free of interference for radio frequency transmissions. An alternate solution is to design the fob such that the fob's output power increases due to coupling from a hand proximate to the antenna. A fob transceiver may be designed such that an electrical coupling between a hand (or other object) and the radio frequency antenna causes an improved matching between an output impedance of a power amplifier and an effective load impedance seen by the power amplifier. The improved matching may improve output power and increase the range of the fob. This may have the advantage of an easier fob design, by allowing the antenna to be disposed, e.g., in a location near to input buttons, within the input buttons, or near other areas of the fob, which are likely to be contacted by the hand (or portion of the hand, e.g., a thumb) during operation. For example, the antenna may be disposed below an outer surface of a fob, near or in the input buttons.

Figure 1:
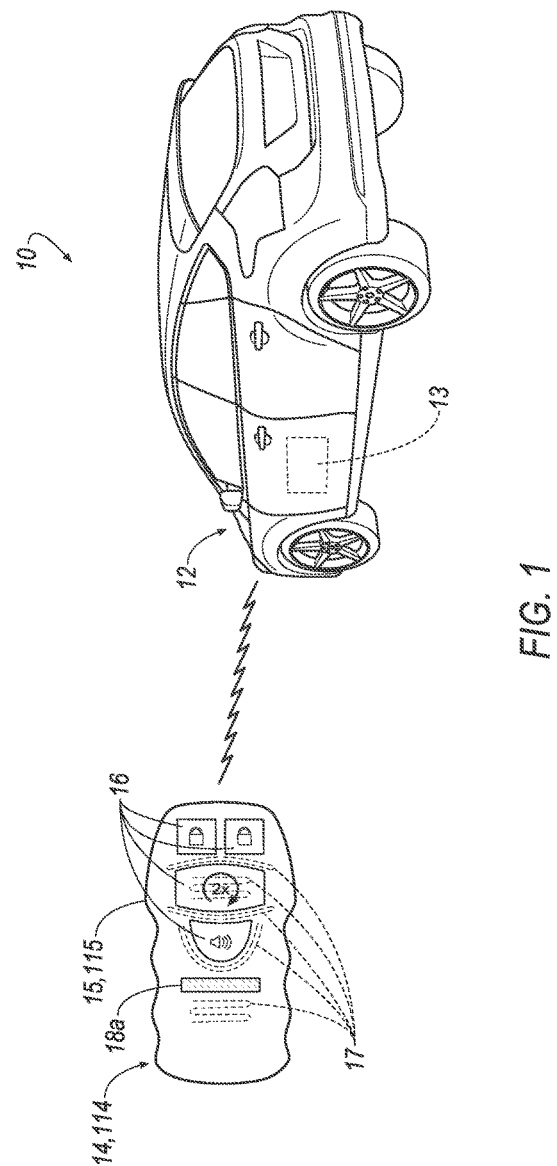
FIG. 1 is diagram of an example remote keyless entry system, including an example fob.

FIG. 1 illustrates an example of a remote keyless entry (RKE) system 10 for a vehicle 12. The RKE system 10 provides for remote control from a fob 14 for various vehicle 12 applications such as door locks, trunk latch, interior and exterior lights, engine start, climate control, etc. The vehicle 12 is generally a land-based vehicle having two or more wheels, e.g., a passenger car, light truck, a motorcycle, etc. The vehicle 12 includes a base station 13 for receiving messages from the fob 14 and optionally transmitting messages to the fob 14.

The fob 14 transmits messages to the base station 13 and may also receive messages from the base station 13. Communications between the fob 14 and the base station 13 are typically radio frequency (RF) communications. As is known, typical fob 14 frequencies of operation for one-way communication are 315 MHz or 433 MHz, and for two-way communications are 902 MHz or 868 MHz.

The fob 14 includes a case 15 and one or more input buttons 16 for receiving inputs from an operator. The case 15 encloses electronic circuitry to facilitate radio frequency (RF) communications, as is known. The electronic circuitry includes a transceiver for transmitting RF communications to, and in the case of two-way communications, receiving RF transmissions from, the vehicle 12. The transceiver includes one or more antennas 17, which may be disposed, as described below, in the case 15. Additionally, the fob 14 includes a ground plane 18. When under power, i.e., when a battery or direct current power supply is connected to the electronic circuitry, the ground plane 18 is at ground potential, typically zero volts. As discussed below, the ground plane 18 may have one or more coupling portion 18a, for coupling with a hand of the operator. The coupling portion 18a may be, e.g., embedded in the case 15.

Figure 2:
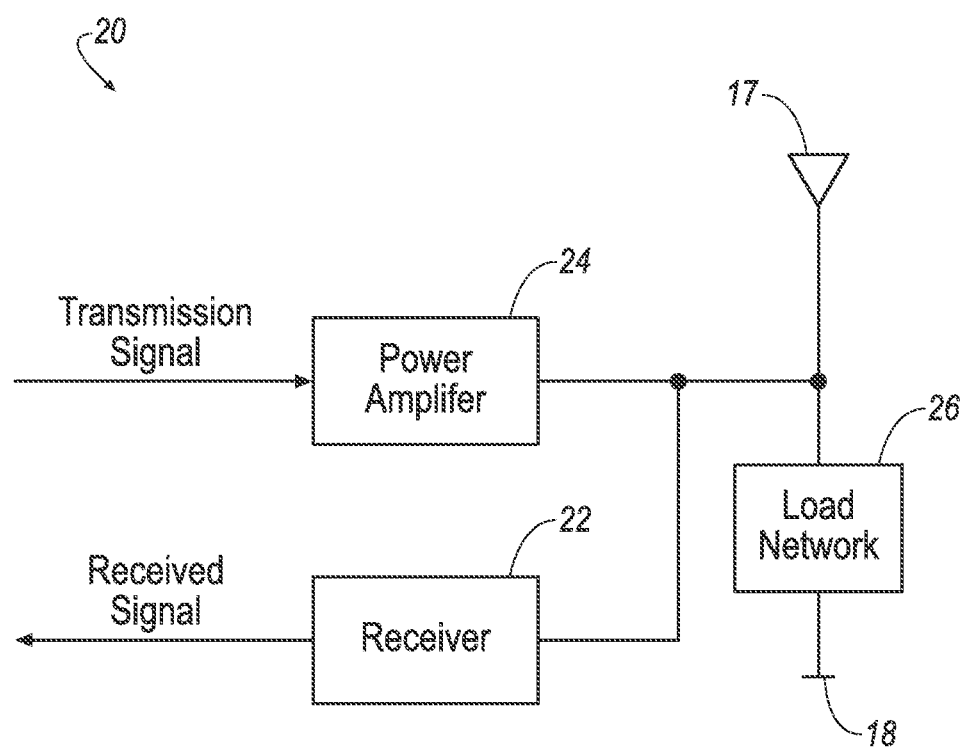
FIG. 2 is a diagram of a transceiver for the exemplary fob of FIG. 1.

As shown in FIG. 2, an exemplary transceiver 20 for the fob 14 includes a power amplifier 24, one or more antennas 17, and, in implementations in which the transceiver 20 is configured for two-way communications, a receiver 22. The transceiver 20 may further include, e.g., a load network 26. The load network 26 may include one or more passive components, e.g., resistors, capacitors, inductors, etc., and may be connected, for example, from an output of the power amplifier to the ground plane 18.

The receiver 22 may receive radio frequency (RF) signals from, e.g., the vehicle 12 via the antenna 17. Based on the received RF signals, the receiver 22 may generate a received signal which is output, for example, to a computer included in the fob 14.

The power amplifier 24 receives a transmission signal, e.g., from a radio frequency signal generator, as is known, then increases a power level of the transmission signal, and outputs the increased power level transmission signal to the RF antenna 17.

The power amplifier 24 is characterized by an output impedance. The output impedance may have an ohmic component, and may additionally have a reactive component. For example, a value of the output impedance for the power amplifier may be nominally 50 Ohms. The impedance may include a frequency dependent reactive component, due to, e.g., inductance in wires connecting the output amplifier to the antenna 17. For example, a wire with 20 nH of inductance has an impedance of approximately j50 Ohms at a frequency of 400 MHz.

The one or more antennas 17 transmit RF output signals to the vehicle 12, and in the case of two-way communications, receive RF input signals from the vehicle 12. The antenna 17, together with the load network 26, may present a load impedance to the power amplifier 24.

A matching of the load impedance presented to the output amplifier 24 and the output impedance of the power amplifier 24 affects the output power of the transceiver 20. A maximum output power level is obtained when the load impedance matches the output impedance of the power amplifier 24. However, the load impedance may be influenced by the presence of a hand operating the fob 14.

Figure 3:
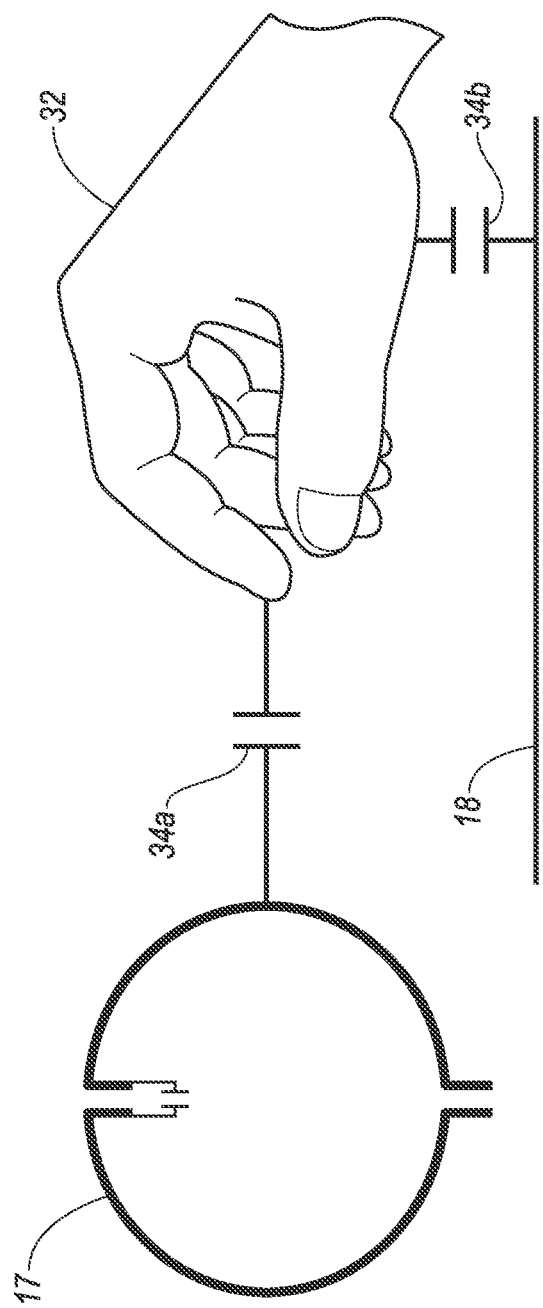
FIG. 3 is a diagram illustrating an exemplary coupling between a hand and a radio frequency antenna in the exemplary fob of FIG. 1.

As shown in FIG. 3, a hand 32 operating the fob 14 may be electrically coupled to the antenna 17. For example, a first capacitive coupling 34a may be formed between the antenna 17 and the hand 32. A second capacitive coupling 34b may be formed between the hand 32 and the ground plane 18. The combination of the first capacitive coupling 34a and second capacitive coupling 34b, may electrically couple the hand 32 to the antenna 17 such the load impedance presented to the power amplifier 24 is changed.

In order to maximize the output power of the transceiver 20, the load impedance of the antenna 17 and load network 26 may be selected such that the change of load impedance due to the presence of the hand 32 improves the matching between the load impedance and the output impedance of the power amplifier 24.

The capacitive coupling 34a of the hand 32 to the antenna 17 may vary, depending on a first distance of the hand 32 from the antenna 17. Similarly, the capacitive coupling of the hand 32 to the ground plane 18 may vary depending on a second distance between the hand 32 and the ground plane 18. In order to reduce the effects of this variation, the fob 14 case 15 may be dimensioned and the components arranged such that the variation of distance of the hand 32 to the antenna 17 and ground plane 18 are minimized.

For example, as further discussed below, one or both of the antenna 17 and a coupling portion 18a of the ground plane 18, may be embedded in the case 15, respectively a first and second predetermined distance below an outer surface of the case 15. The first and second predetermined distances may each be, for example, 1 millimeter. The antenna 17 and coupling portion 18a of the ground plane 18 may similarly be disposed in the case 15 near a location which is likely to be in contact with the hand 32 during operation of the fob 14.

For example, one or both of the antenna 17 and coupling portion 18a of the ground plane 18 may be disposed within respective third and fourth predetermined distances from the buttons 16 used to operate the fob 14. The third and fourth predetermined distances may be, for example, 0.5 centimeters. Additionally or alternatively, for example, one or both of the antenna 17 and coupling portion 18a of the ground plane 18 may be disposed on a surface of the fob 14 opposite the buttons 16, where an operator is likely to apply counter pressure during operation of the buttons 16. Other examples are presented below.

Figure 4:
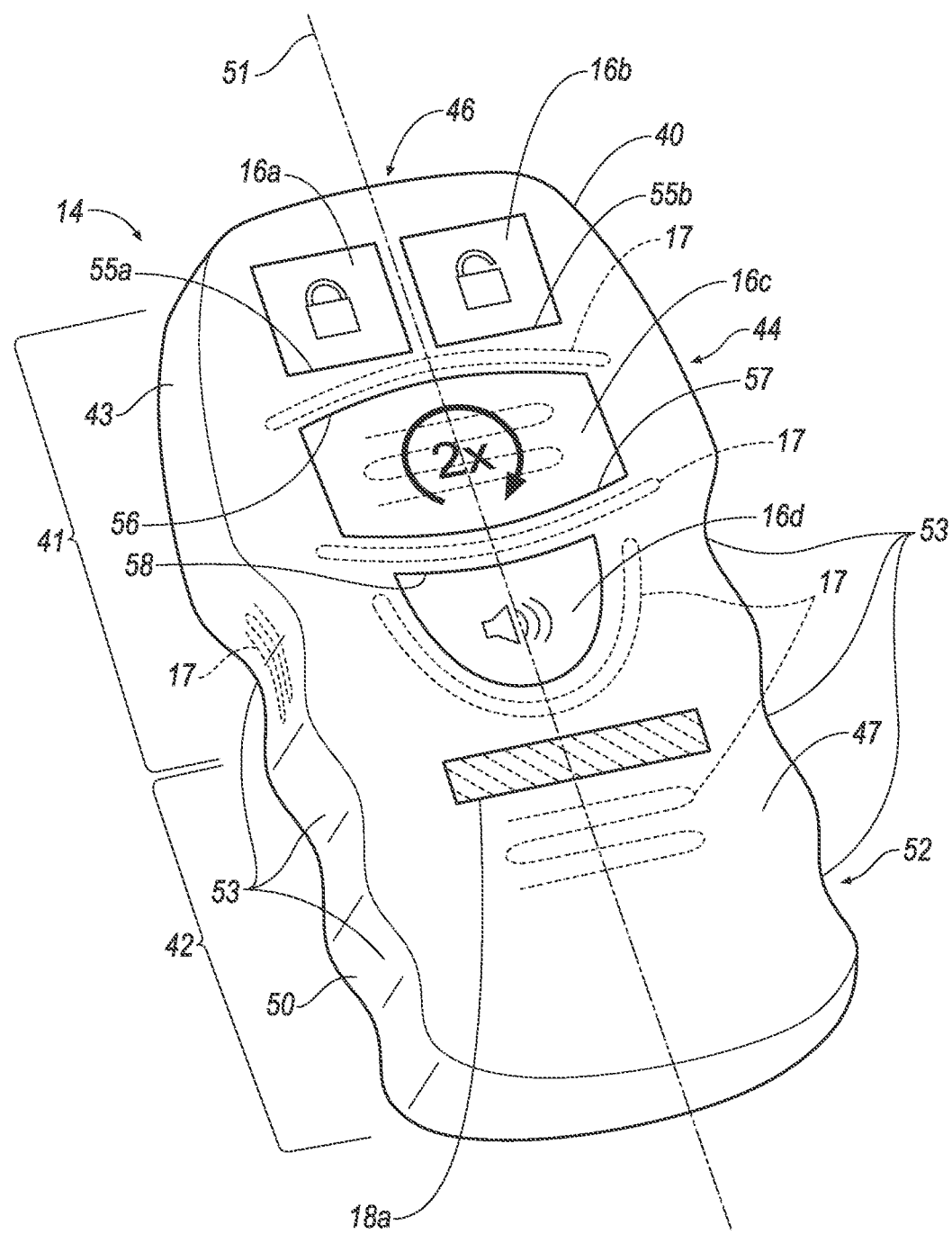
FIG. 4 is a perspective view of an exemplary fob.
Figure 5A:
FIG. 5A is a front end view of the exemplary fob of FIG. 4.
Figures 5B, 5C:
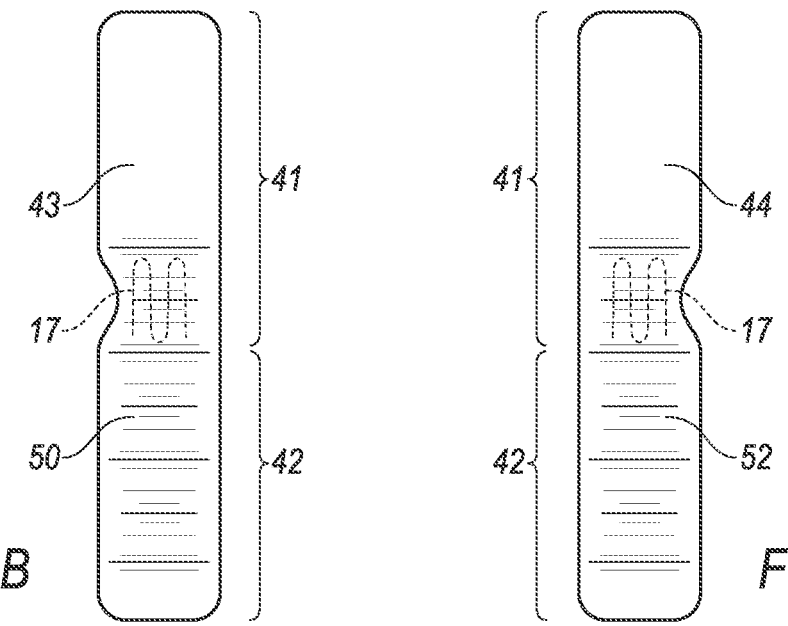
FIG. 5B is a left side view of the exemplary fob of FIG. 4.
FIG. 5C is a right side view of the exemplary fob of FIG. 4.
Figure 5D:
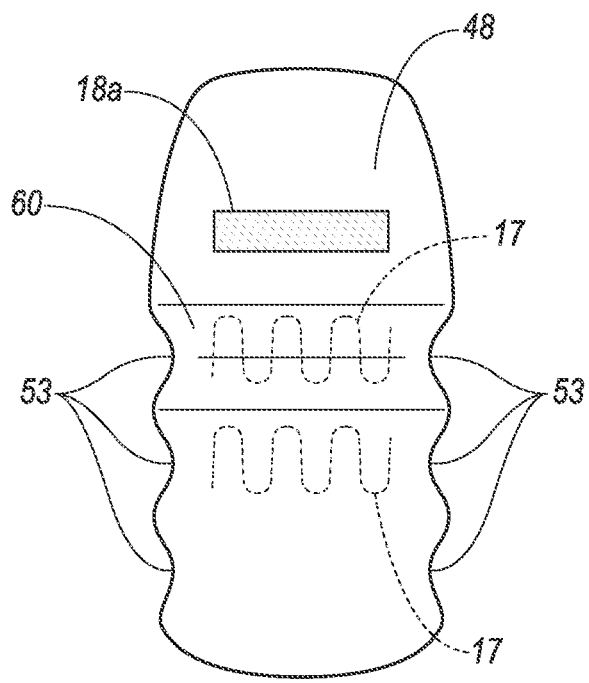
FIG. 5D is a bottom view of the exemplary fob of FIG. 4.

An exemplary fob 14 is shown in FIGS. 4 and 5A-5D. The fob 14 includes the case 15. The case 15 may be generally in the form of a rounded, rectangular box, forming an internal cavity. The internal cavity encloses the transceiver 20, and other electronic circuitry, to facilitate radio frequency communications, as discussed above. The case 15 includes an interface portion 41, a handle portion 42, a top surface 47 and a bottom surface 48 (FIG. 5D). The case 15 may, for example, be formed of a hardened plastic or other non-conductive material.

The interface portion 41 includes left lateral side 43, right lateral side 44, and a front end 46, and may further include one or more input buttons 16. The one or more input buttons 16 may be disposed on the top surface 47, and include, for example, first, second, third and fourth input buttons 16a, 16b, 16c, 16d.

At least one antenna 17 may be disposed on the interface portion 41. The antenna 17 may be, e.g., a wire embedded within, e.g., the top surface 47 and/or bottom surface 48.

The capacitive coupling 34a between the hand 32 operating the fob 14 and the antenna 17 depends on a distance between the hand 32 and the antenna 17. In order to increase a predictability of the capacitive coupling 34a, the antenna 17 may be located a predetermined distance below an outer surface of the fob 14. The predetermined distance may be, for example, one millimeter. The predetermined distance may be chosen based on the value of the capacitive coupling 34a that is desired, based on manufacturing tolerances, etc. For example, as shown in FIG. 4, the antenna 17 may be disposed near a top surface 47, within the hardened plastic or other non-conductive material used to form the case 15.

Additionally, the antenna 17 may be located, e.g., in a position near or in between the input buttons 16. As shown in FIG. 4, the antenna 17 may be located between bottom edges 55a, 55b respectively of the first and second buttons 16a, 16b, and a top edge 56 of the third button 16c. As another example, the antenna 17 may be disposed below a bottom edge 57 of the third input button 16c and above a top edge 58 of the fourth input button 16d. In each of these examples, a likelihood that a thumb on the hand 32 will be near to the antenna 17 is high, during an activation of one of the buttons 16. Because the buttons 16 are suppressed during activation, a variation in a distance between the thumb and the antenna 17, due to, e.g., holding the fob 14 in different orientations may be minimized.

In order to increase the predictability of the capacitive coupling 34b between the ground plane 18 and the hand 32 operating the fob 14, the ground plane 18 may include a coupling portion 18a. The coupling portion 18a may be for example, a metal plate or wire electrically connected to the ground plane, and may be disposed in the case 15. The coupling portion 18a of the ground plane may be located a predetermined distance, e.g., one millimeter, below an outer surface of the fob 14. The predetermined distance may be chosen based on the value of the capacitive coupling 34b that is desired, based on manufacturing tolerances, etc. As shown in FIG. 4, the antenna 17 may be disposed near a top surface 47, within the hardened plastic or other non-conductive material used to form the case 15.

The antenna 17 and coupling portion 18a of the ground plane 18 may be disposed in other locations within the fob 14. For example, as shown in FIGS. 5B, 5C and 5D, the antenna may be disposed on a left side 43, 50, on a right side 44, 52, and/or on the a bottom surface 48 of the fob 14. For example, a finger groove 60 (FIG. 5D) may be formed in the bottom surface 48, and the antenna 17 may be disposed in the finger groove 60. As described above, the antenna 17 may be disposed a predetermined distance, for example one millimeter, below the bottom surface 48.

Similarly, the coupling portion 18*a* of the ground plane 18 may be disposed, for example, on the bottom surface 48, at a location opposite the input buttons 16.

In order to increase predictability of the capacitive coupling 34*b* between the coupling portion 18*a* of the ground plane 18 and the hand 32 operating the fob 14, the coupling portion 18*a* of the ground plane 18 may be located, e.g., in a position near the input buttons 16. As one example and as shown in FIG. 4, the coupling portion 18*a* of the ground plane 18 may be located below a bottom edge 59 of the fourth input button 16*d*. This is an area where the thumb operating the fob 14 is likely to cross over or touch during operation of the fob 14 (see, e.g., FIG. 6).

As further shown in FIGS. 4 and 5A-5D, the case 15 includes a handle portion 42. The handle portion 42 extends from a side of the interface portion 41 opposite the front end 46 in the direction of a center axis 51 and has left and right lateral sides 50, 52.

The predictability of the respective values of the capacitive coupling 34*a* between the hand 32 and the antenna 17, and the capacitive coupling 34*b* between the hand 32 and the ground plane 18, may be increased by forming the fob 14 to direct an orientation of the hand 32 holding the fob 14. For example, the fob 14 handle portion 42 may include one or more finger positioners 53. The finger positioners 53 may be, for example, one or more grooves formed in each of the left and right lateral sides 50, 52 of the handle portion 42. The grooves may have a shape that corresponds to a shape of at least a portion of a human finger, e.g., an inside (palm side) of the finger. In the case that there is more than one finger positioner 53, the finger positioners 53 may be arranged adjacently, with a spacing corresponding to the spacing of fingers on the human hand 32. The grooves may direct an operator of the fob 14 to hold the fob 14 such that fingers of the hand 32 are placed in the grooves 53. In this manner, a thumb of the hand 32 may naturally extend from the handle portion 42 toward the interface portion 41. As described above, the antenna 17 and coupling portion 18*a* of the ground plane 18 may be disposed on the fob 14 such that the thumb is passes over them when the fob 14 is operated in a directed orientation.

A shape of the bottom surface 49 of the fob 14 case 15 may also be used to direct the orientation of the hand 32 when operating the fob 14. For example, as shown in FIG. 5D, the bottom surface 48 may include a finger slot 60. The finger slot 60 may be a groove formed in the bottom surface 48 and shaped to receive a finger. The finger slot 60 on the bottom surface 48 may be aligned, e.g., with one of the finger positioners 53 formed in the left and right lateral sides 50, 52. In the case where there is more than one finger positioner element 53 formed in the left and right lateral sides 50, 52, the finger slot 60 in the back surface 48 may be aligned with the finger positioner 53 nearest the interface portion 41. This position corresponds to a position of an index finger holding the fob 14 in a directed orientation. In the directed orientation, the other fingers of the hand of the operator holding the fob 14 are placed on the handle portion 42 on a side of the finger slot 60 opposite the interface portion 41.

Figure 6:
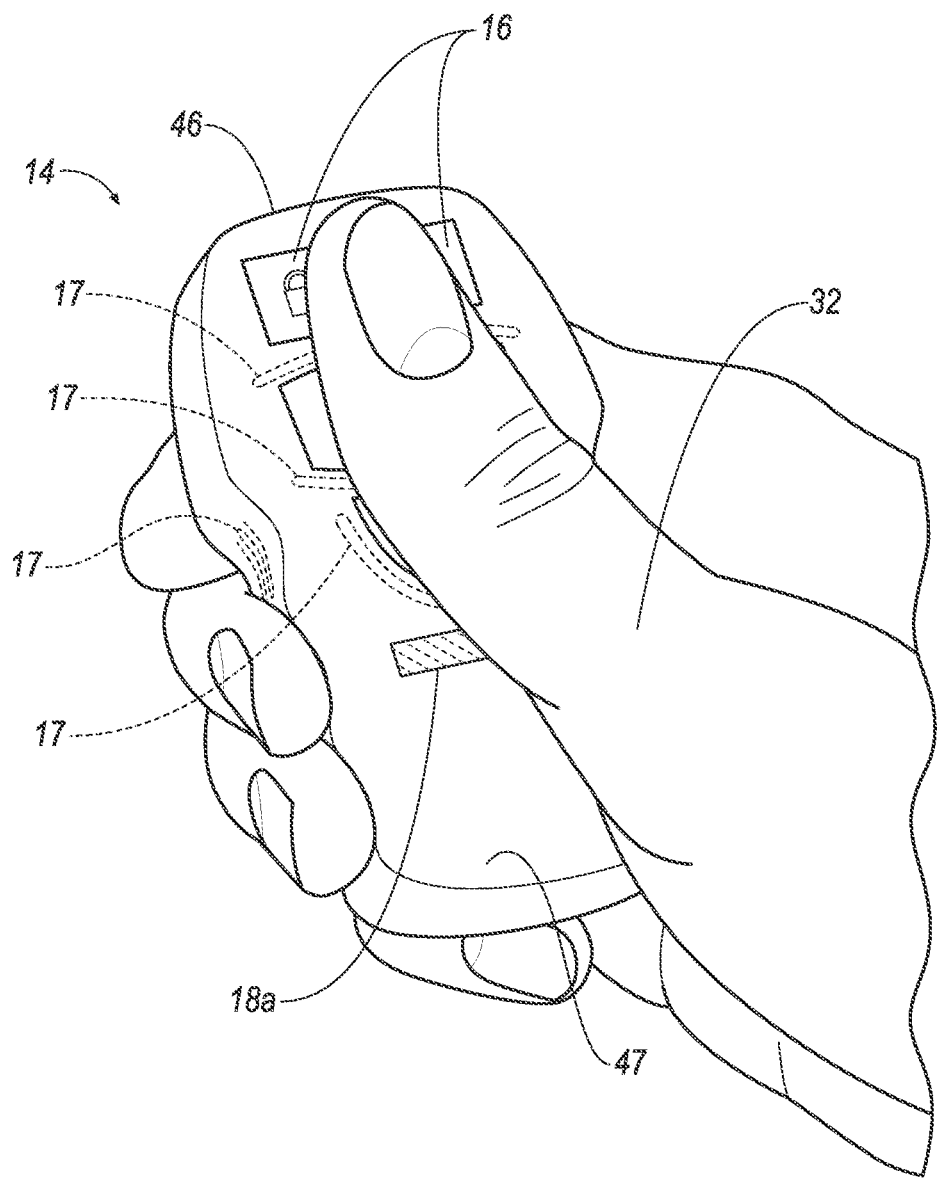
FIG. 6 is a perspective view of a hand holding the exemplary fob of FIG. 4.

FIG. 6 illustrates the example fob 14 of FIGS. 4 and 5A-5D, being held in the directed orientation. The fingers are directed to hold the fob 14 at the handle portion 42 by the finger positioners 53. The index finger of the hand is directed to the finger slot 60 on the bottom surface 49 (FIG. 5D). As shown, there are multiple locations where an antenna 17 may be placed such that the thumb of the hand 32 is near the antenna 17 during operation of the fob 14. Similarly, an ground plane coupling portion 18*a* may be placed, e.g., on the top surface 47 of the handle portion 42, such that the thumb is near to the ground plane coupling portion 18*a*.

Figure 7A:
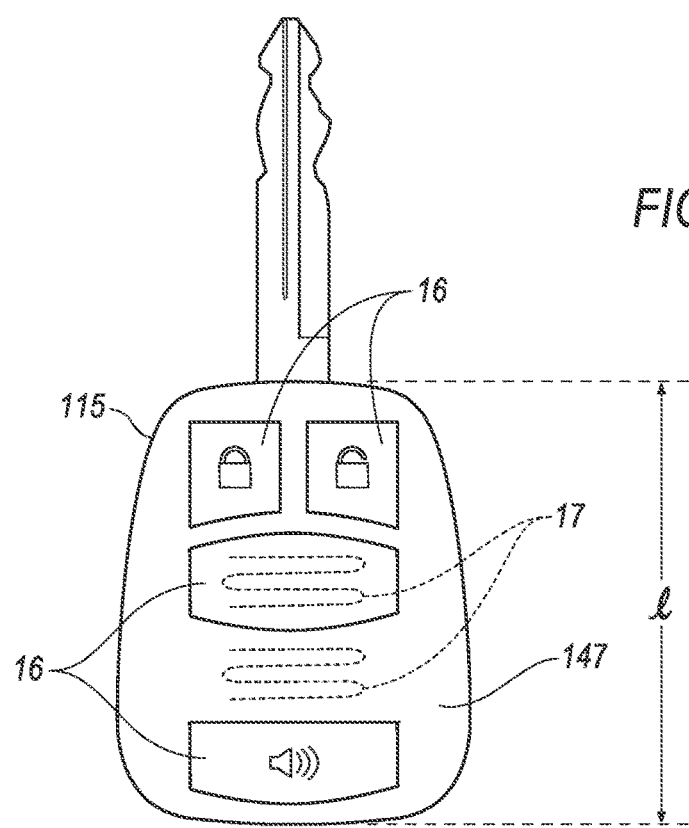
FIG. 7A is a front view of an exemplary fob.
Figure 7B:
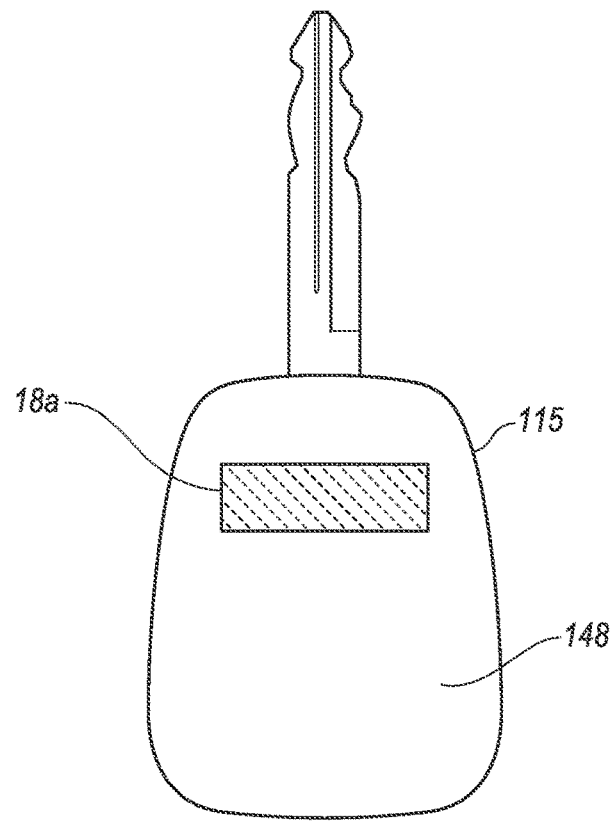
FIG. 7B is a bottom view of the exemplary fob of FIG. 7A.

A second exemplary fob 114 is shown in FIGS. 7A and 7B. The fob 114 includes a case 115 which has a top surface 147 and a bottom surface 148. The fob 114 further includes one or more inputs 16, one or more antennas 17 as described above with reference to the fob 14. The fob 114 further includes the transceiver 20, as shown in FIG. 2. The transceiver section 20 is connected to and receives its electrical ground connection from the ground plane 18. Also, as described with regard to the fob 14, the ground plane 18 may include a coupling portion 18*a*, which is electrically connected to the ground plane 18, and, e.g., embedded within the case 115.

The fob 114 may be, formed within a handle portion of a key, and may be relatively small. For example, a length of the fob 114 may be substantially five centimeters. Due to this relatively small size, most areas of the fob 114 will be in direct or near contact with the hand 32 holding the fob 114 during operation. Including the predicted electrical coupling 34*a* of the hand 32 with the antenna 17 may have the advantage of more options for placement of the antenna 17 within the fob 114.

As shown in FIG. 7A, an antenna 17 may be placed, for example on the top surface 148, in between one or more of the inputs 16. Additionally or alternatively, the antenna 17 may be placed within one of the inputs 16. As described above, the antenna 17 may be embedded in the casing, a predetermined distance, e.g., one millimeter, below the top surface 147.

As further indicated in FIG. 7B, in order to increase the predictability of the coupling 34*b* between the hand 32 and the ground plane coupling portion 18*a* may be embedded a predetermined distance below the bottom surface 148 of the fob 114. The predetermined distance may be, e.g., one millimeter.

Figure 8:
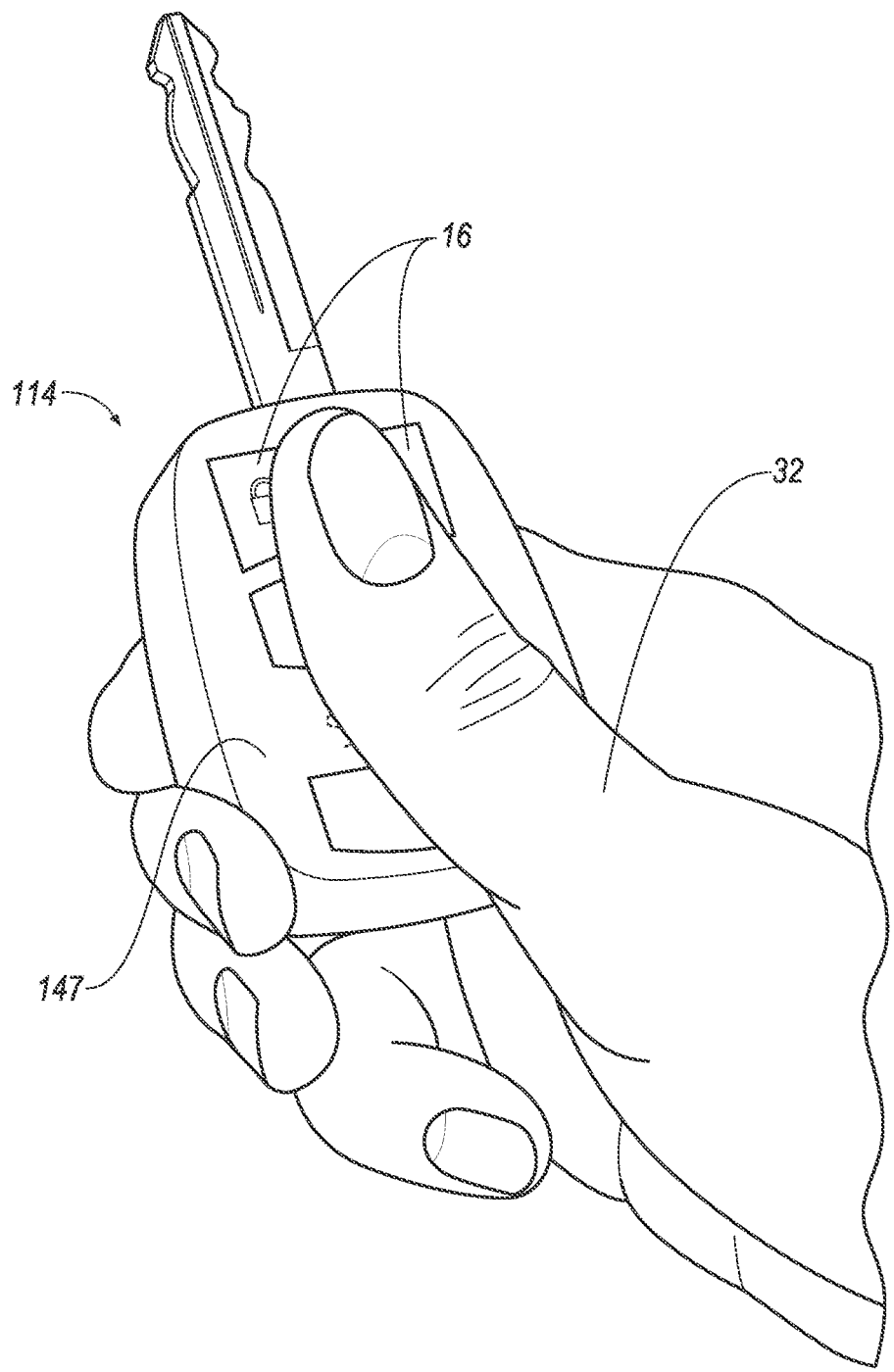
FIG. 8 is a perspective view of a hand holding the exemplary fob of FIGS. 7A and 7B.

FIG. 8 illustrates the example fob 114 of FIGS. 7A and 7B, being held by a hand 32 in a natural position. The thumb extends over a substantial portion of the top surface 147, and the fingers cover a substantial portion of the bottom surface 148 (see FIG. 7B). Accordingly, there are multiple options on the top surface 147, on the bottom surface 148, and within the inputs 16 for placement of the antenna 17 and, when utilized, the ground plane coupling portion 18*a*, such that a respective capacitive coupling 34*a*, 34*b*, is formed.

The placements of the antenna 17 and the ground plane coupling portion 18*a* discussed herein are only examples. The antenna 17 may be placed in any location on the fob 114 where a strong coupling with the hand 32 may be formed during operation of the fob 114. Similarly, the coupling portion 18*a* of the ground plane 18 may be placed in any location on the fob 114 where a strong coupling with the hand 32 may be formed. Note that, with regard to the ground plane 18, a coupling portion may not be necessary. The ground plane 18 may be distributed substantially through the fob 114, such that a sufficient coupling is formed without the provision of the ground plane coupling portion 18*a*.

As used herein, the adverb "substantially" means that a shape, structure, measurement, quantity, time, etc. may deviate from an exact described geometry, distance, measurement, quantity, time, etc., because of imperfections in materials, machining, manufacturing, etc.

The term "exemplary" is used herein in the sense of signifying an example, e.g., a reference to an "exemplary widget" should be read as simply referring to an example of a widget.

In the drawings, the same reference numbers indicate the same elements. Further, some or all of these elements could be changed. Accordingly, it is to be understood that the above description is intended to be illustrative and not restrictive. Many embodiments and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

The invention claimed is:

1. A fob, comprising:
   a power amplifier including an output having an output impedance;
   a radio frequency antenna connected to the power amplifier output representing a first load impedance to the power amplifier output in a space free of interference for radio frequency transmissions resulting in a first level of output power, and a second load impedance to the power amplifier output when a hand of a user is capacitively coupled to the antenna, the second load impedance determined at least in part by a combination of the first load impedance and a capacitive coupling of the hand to the antenna; wherein a difference between the second load impedance and the output impedance of the power amplifier is less than a difference between the first load impedance and the output impedance, resulting in a second level of output power, the second level of output power greater than the first level of output power, without adjusting the second load impedance subsequent to the capacitive coupling of the hand to the antenna.

2. The fob of claim 1, further comprising:
   an electrical load network connected between the power amplifier output and a reference electrical potential, wherein each of the first and second load impedances is determined in part based on the load network.

3. The fob of claim 2, wherein the reference electrical potential is a ground potential.

4. The fob of claim 1, further comprising:
   a case having an outer surface; wherein the radio frequency antenna is embedded in the case and disposed a first predetermined distance below the outer surface.

5. The fob of claim 4, wherein the outer surface includes a top portion including at least one input button, and the radio frequency antenna is disposed a second predetermined distance from the input button.

6. The fob of claim 1, further comprising:
   a case having an outer surface, wherein the outer surface includes an upper portion including at least one input button, and the radio frequency antenna is disposed in the button.

7. The fob of claim 6, wherein the input button has an upper surface, and the radio frequency antenna is disposed a third predetermined distance from the upper surface of the input button.

8. The fob of claim 1, further comprising:
   a case having an outer surface; and
   a ground plane that provides a ground reference potential for the power amplifier when the fob is under power, the ground plane including a coupling portion, wherein the coupling portion is disposed within the case.

9. The fob of claim 8, wherein the coupling portion is disposed a fourth predetermined distance from the outer surface of the case.

10. The fob of claim 1, wherein the fob further comprises:
    at least one hand positioning element arranged to orient an operator's hand on the key fob toward the antenna.

11. The fob of claim 10, wherein the at least one positioning element includes at least one finger positioner.

12. The fob of claim 1, wherein the fob further comprises:
    a case having an outer surface, the outer surface having a top portion and a bottom portion opposite the top portion;
    at least one input arranged on the top portion of the outer surface; and
    a finger slot formed in the bottom portion of the outer surface; wherein the antenna is embedded in the case, and within the finger slot.

13. A fob, comprising:
    a power amplifier including an output having an output impedance;
    a radio frequency antenna connected to the power amplifier output representing a first load impedance to the power amplifier output in a space free of interference for radio frequency transmissions resulting in a first level of output power, and a second load impedance to the power amplifier output when a hand of a user is capacitively coupled to the antenna, the second load impedance determined at least in part by a combination of the first load impedance and a capacitive coupling of the hand to the antenna; wherein a matching of the second load impedance to the output impedance is improved relative to a matching of the first load impedance to the output impedance, resulting in a second level of output power, the second level of output power greater than the first level of output power, without adjusting the second load impedance subsequent to the capacitive coupling of the hand to the antenna.

14. The fob of claim 13, further comprising:
    a case having an outer surface; wherein the radio frequency antenna is embedded in the case and disposed a first predetermined distance below the outer surface.

15. The fob of claim 14, wherein the outer surface includes a top portion including at least one input button, and the radio frequency antenna is disposed a second predetermined distance from the input button.

16. The fob of claim 13, further comprising:
    a case having an outer surface; and
    a ground plane that provides a ground reference potential for the power amplifier when the fob is under power, the ground plane including a coupling portion, wherein the coupling portion is disposed within the case.

17. The fob of claim 16, wherein the coupling portion is disposed a first predetermined distance from the outer surface of the case.

18. The fob of claim 13, wherein the fob further comprises:

at least one hand positioning element arranged to orient an operator's hand on the key fob toward the antenna.

19. The fob of claim 18, wherein the at least one positioning element includes at least one finger positioner.

20. The fob of claim 13, wherein the fob further comprises:
- a case having an outer surface, the outer surface having a top portion and a bottom portion opposite the top portion;
- at least one input arranged on the top portion of the outer surface; and
- a finger slot formed in the bottom portion of the outer surface; wherein the antenna is embedded in the case, and within the finger slot.

* * * * *